United States Patent [19]

Mahabadi

[11] Patent Number: 5,164,680

[45] Date of Patent: Nov. 17, 1992

[54] CIRCUIT AND METHOD OF CONTROLLING THE GAIN OF AN AMPLIFIER BASED ON THE OUTPUT FREQUENCY THEREOF

[75] Inventor: John K. Mahabadi, Tempe, Ariz.

[73] Assignee: Motorola, Inc., Schaumburg, Ill.

[21] Appl. No.: 772,526

[22] Filed: Oct. 7, 1991

[51] Int. Cl.$^5$ .............................................. H03F 3/26
[52] U.S. Cl. ................................... 330/264; 330/267; 330/297; 330/285
[58] Field of Search ............... 330/123, 128, 132, 267, 330/273, 264, 285, 297

[56] References Cited

U.S. PATENT DOCUMENTS 4,329,657  5/1982  Kamiya ........................... 330/267 X
4,468,630  8/1984  Narukawa et al. ............... 330/132 X

FOREIGN PATENT DOCUMENTS 111507  7/1983  Japan .................................. 330/297

Primary Examiner—James B. Mullins
Attorney, Agent, or Firm—Robert D. Atkins

[57] ABSTRACT

A frequency-controllable amplifier circuit is responsive to a frequency sensor for controlling the transconductance of an amplifier by adjusting the power supply potential thereof. The frequency sensor monitors the output frequency of the amplifier and generates a control signal having a first state upon detecting the output frequency above a predetermined threshold. The first state of the control signal increases the power supply potential to the amplifier which increase its transconductance. The frequency sensor also detects when the output frequency of the amplifier is below the predetermined threshold and switches the control signal to a second state to decrease the power supply potential to the amplifier which reduces its amplification.

8 Claims, 2 Drawing Sheets

CIRCUIT AND METHOD OF CONTROLLING THE GAIN OF AN AMPLIFIER BASED ON THE OUTPUT FREQUENCY THEREOF

BACKGROUND OF THE INVENTION

The present invention relates in general to amplifiers and, more particularly, to an amplifier having controllable gain based on the output frequency thereof.

Amplifiers are commonly used in electronic circuit design to amplify an input signal over a predetermined frequency range and provide an output signal having increased magnitude. For example, an amplifier operating as a low-pass filter propagates the input signal if its frequency is below a predetermined threshold while higher frequency signals are attenuated based on the frequency response of the filter. The attenuating effect on the high frequency components of the input signal is attributed to losses in the external passive feedback components rather than the amplifier itself. Indeed, the amplifier continues to consume power irrespective of the frequency of the input signal.

Depending on the specific application, the input signal may be valid for only a small portion of the overall period of time that the amplifier is powered on. For example, in voice processing applications, an amplifier may process valid voice data only when the user speaks into a microphone. Yet, the amplifier continues to consume power when just random noise is present at the input. Thus, in some instances, prior art amplifier circuits are known to consume an appreciable amount of power relative to their useful operating period which is undesirable especially in battery driven applications.

Hence, what is needed is an improved amplifier circuit which saves power by reducing its amplification factor when the input signal does not contain valid data.

SUMMARY OF THE INVENTION

Briefly stated, the present invention comprises a frequency controllable amplifier including an amplifier circuit having a control input responsive to a first state of a control signal for amplifying an input signal with a power supply potential and providing an output signal having increased magnitude at an output. The amplifier circuit switches to a reduced power supply potential upon receiving a second state of the control signal. A first circuit includes an input coupled to the output of the amplifier circuit for detecting an output frequency of the amplifier and an output for providing the control signal having the first state when the output frequency is greater than a predetermined threshold and the second state when the output frequency is less than the predetermined threshold.

In another aspect, the present invention is a method of controlling the transconductance of an amplifier by adjusting the power supply potential thereof comprising the steps of monitoring an output frequency of the amplifier, increasing the power supply potential to the amplifier to increase its amplification in response to a first state of a control signal upon detecting the output frequency of the amplifier above a predetermined threshold, and decreasing the power supply potential to the amplifier to reduce its amplification in response to a second state of the the control signal upon detecting the output frequency of the amplifier below the predetermined threshold.

DETAILED DESCRIPTION OF THE PREFERRED EMBODIMENT

Figure 1:
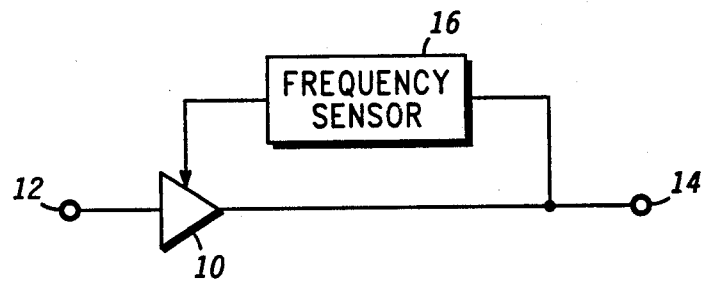
FIG. 1 is a block diagram illustrating a frequency controlled amplifier.

A frequency-controlled amplifier 10 is shown in FIG. 1 responsive to an input signal applied at terminal 12 for providing an amplified output signal at terminal 14. The input signal, for example, may be voice data operating as a square waveform with a random frequency, usually less than 20 KHz. The present invention operates equally well with higher frequency input signals. Frequency sensor 16 includes an input coupled to terminal 14 for sensing the output frequency of amplifier 10 and an output coupled to a control input of amplifier 10 for altering its power supply potential and associated amplification factor and power consumption.

If valid voice data is present at terminal 12, then the output frequency of amplifier 10 is assumed to be above a predetermined threshold, say 5 KHz. Frequency sensor 16 having detected the output frequency above the predetermined threshold enables the amplification through amplifier 10 by increasing its power supply potential. Alternately, when the input signal is essentially low-frequency noise, the output signal of amplifier 10 drops below the predetermined frequency threshold. Frequency sensor 16 also detects the absence of voice data by looking for a low-level, low-frequency output signal and reduces the power supply voltage of amplifier 10 to save power consumption.

Figure 2:
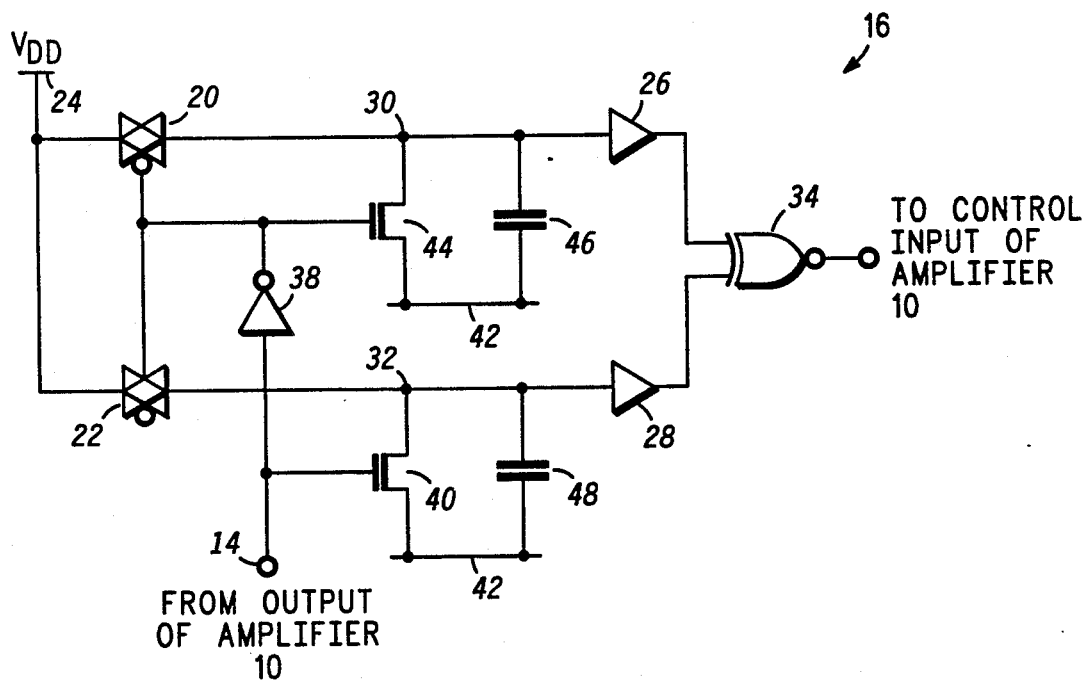
FIG. 2 is a schematic diagram illustrating the frequency sensor of FIG. 1.

Turning to FIG. 2, frequency sensor 16 is shown with further detail including transmission gates 20 and 22 each having an input coupled to power supply conductor 24 operating at a positive potential such as $V_{DD}$. The output of transmission gates 20 and 22 are coupled to the inputs of Schmitt triggers 26 and 28 at nodes 30 and 32, respectively, which in turn drive the first and second inputs of exclusive-NOR gate 34. The output signal of exclusive-NOR gate 34 is applied at the control input of amplifier 10. The output signal of amplifier 10 is applied at the input of inverter 38 and to the gate of transistor 40, the latter of which also includes a drain coupled to node 32 and a source coupled to power supply conductor 42 operating at ground potential. The output of inverter 38 is coupled to the control inputs of transmission gates 20 and 22 and to the gate of transistor 44 which includes a drain coupled to node 30 and a source coupled to power supply conductor 42. Capacitors 46 and 48 are coupled between nodes 30 and 32, respectively, and power supply conductor 42.

In a first mode of operation, assume the output signal of amplifier 10 is operating at a high frequency above the predetermined threshold of 5 KHz, indicating valid voice data at terminal 12. The frequency threshold is set by a combination of the detection levels of Schmitt triggers 26–28, the impedance path through charging transmission gates 20–22, the size of discharge transistors 40 and 44, and capacitors 46–48. The output signal of inverter 38 switches between logic zero and logic one due to the square waveform from amplifier 10, alternately enabling and disabling transmission gates 20 and 22. The high signal from power supply conductor 24 passes through transmission gate 20 and charges node 30 when the output signal of inverter 38 is logic zero. Similarly, the high signal from power supply conductor 24 passes through transmission gate 22 and charges node 32 when the output signal of inverter 38 is logic one. Capacitors 46 and 48 establish the charge rate on nodes 30 and 32.

The conduction paths of transmission gates 20 and 22 are low impedance, while transistors 40 and 44 are made high impedance devices. Although transistors 40 and 44 are alternately enabled by the oscillating signal from terminal 14, the discharge rates on nodes 30 and 32 via transistors 40 and 44 are much less than the charge rates supplied by transmission gates 20 and 22. The signal levels at nodes 30 and 32 thus increase from the charging through transmission gates 20 and 22 until Schmitt triggers 26 and 28 each switch to logic one. The output signal of exclusive-NOR gate 34 becomes logic one with the logic ones at its inputs which enables full power supply and amplification through amplifier 10 as will be shown. Thus, a valid high frequency data signal at the output of amplifier 10 charges both nodes 30 and 32 to a high level and produces a logic one control signal at the output of exclusive-NOR gate 34.

Now consider the case of an absence of voice data at terminal 12 and a corresponding low-frequency, low-level output signal of amplifier 10. The signal level at terminal 14 is essentially low-level noise and may appear as a logic zero for inverter 38. Transistor 40 is turned off while the logic one at the output of inverter 38 enables transmission gate 22 to charge node 32 and switch the output of Schmitt trigger 28 to logic one. The logic one at the output of inverter 38 also disables transmission gate 20 while activating transistor 44. The voltage across capacitor 46 is discharged through transistor 44 over a period of time since transmission gate 20 is disabled. As the voltage at node 30 falls below the lower threshold level of Schmitt trigger 26, the output signal of the latter drops to logic zero and switches the output signal of exclusive-NOR gate 34 to logic zero. A logic zero control signal applied at the control input of amplifier 10 substantially reduces the supply voltage of amplifier 10 and reduces its amplification factor and associated power consumption, further discussion with FIG. 3.

Alternately, if the voice data applied at terminal 12 is absent yet the output signal of amplifier 10 is stuck at logic one, then transistor 40 remains on to discharge capacitor 48 and switch the output of Schmitt trigger 28 to logic zero. With a logic one at the input of inverter 38, its output is logic zero and transmission gate 22 is open-circuited while transmission gate 20 charges node 30 producing a logic one at the output of Schmitt trigger 26. Transistor 44 is disabled by the logic zero at the output of inverter 38. Again, the output of exclusive-NOR gate 34 is logic zero thereby disabling the gain of amplifier 10. When the input signal returns to valid voice data, the output signal of amplifier 10 is again sufficient to start switching inverter 38 between logic zero and logic one which drives nodes 30 and 32 to logic ones and generates the logic one control signal necessary to activate amplifier 10.

Figure 3:
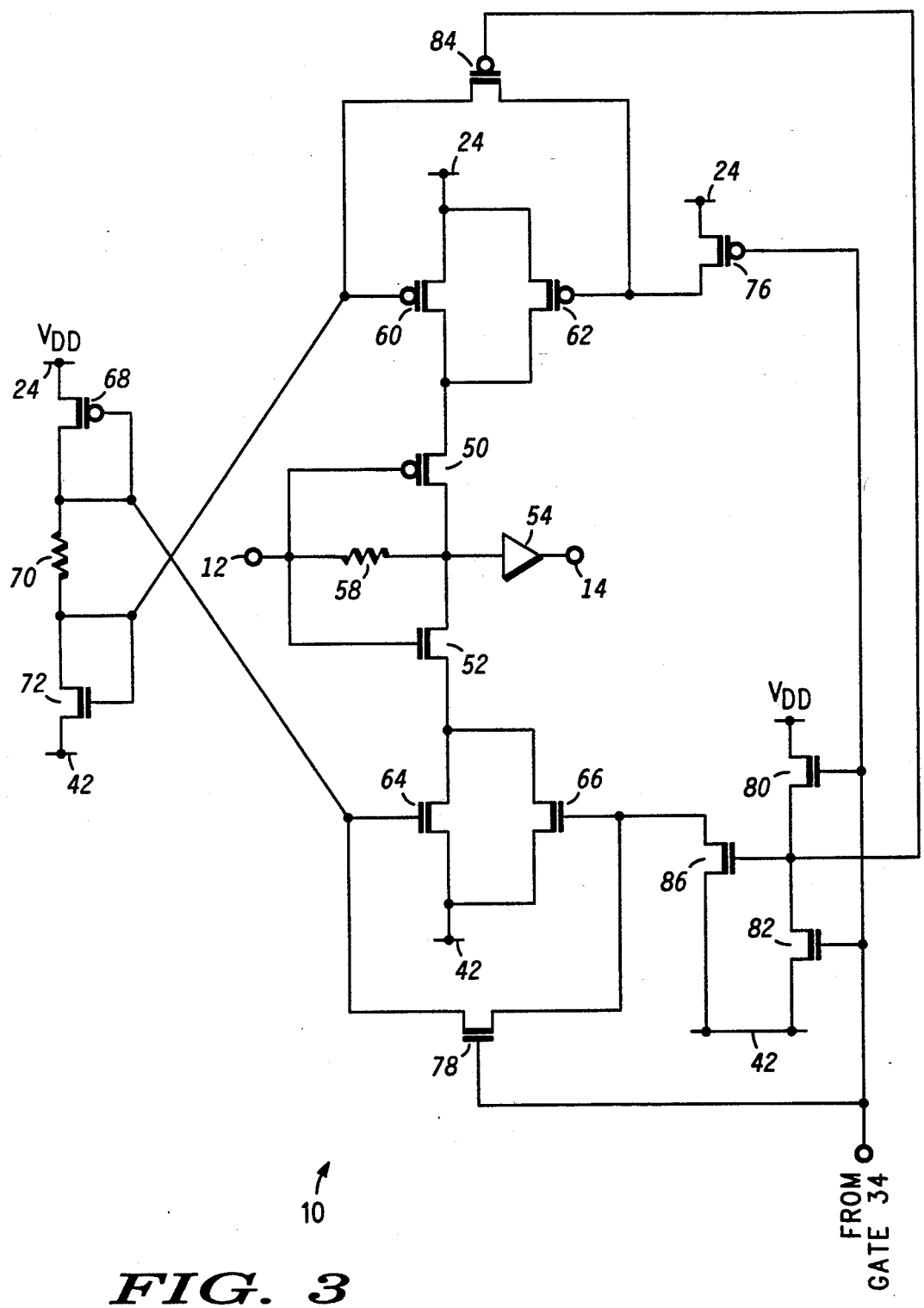
FIG. 3 is a schematic diagram illustrating the amplifier of FIG. 1.

Turning to FIG. 3, amplifier 10 is shown including transistors 50 and 52 each having a gate coupled to terminal 12 and a drain coupled through buffer 54 to terminal 14. Resistor 58 is coupled between the common gates of the transistors 50 and 52 and their common drains. The source of transistor 50 is coupled through the parallel drain-source conduction paths of transistors 60 and 62 to power supply conductor 24. Likewise, the source of transistor 52 is coupled through a parallel combination of transistors 64 and 66 to power supply conductor 42. Transistors 60 and 64 are high impedance devices, and transistors 62 and 66 are low impedance devices. The gates of transistors 60 and 64 receive reference potentials established by a serial combination of diode-configured transistor 68, resistor 70 and diode-configured transistor 72 coupled between power supply conductors 24 and 42.

The control signal from frequency sensor 16, specifically the output signal of exclusive-NOR gate 34, is applied at the gates of transistors 76 and 78 and to the gates of transistors 80 and 82, the latter of which operates as an inverting buffer coupled between power supply conductors 24 and 42. The common drains of transistors 80 and 82 are coupled to the gates of transistors 84 and 86. The drain-source conduction path of transistor 78 is coupled between the gates of transistors 64 and 66, while the drain-source conduction path of transistor 84 is coupled between the gates of transistors 60 and 62. Transistor 76 includes a source coupled to power supply conductor 24 and a drain coupled to the gate of transistor 62. Transistor 86 includes a drain coupled to the gate of transistor 66 and a source coupled to power supply conductor 42.

The operation of amplifier 10 proceeds as follows. The serial combination of diode-configured transistors 68 and 72 with resistor 70 establishes separate bias potentials for transistors 60 and 64 which are high impedance devices separating transistors 50 and 52 from power supply conductors 24 and 42, respectively. First consider the case where the output signal from frequency sensor 16 is logic one indicating valid data for amplifier 10. Transistor 78 is activated passing the bias signal from the gate of transistor 64 to the gate of transistor 66 and enabling the low impedance conduction path through transistor 66 which pulls the source voltage of transistor 52 closer to power supply conductor 42. Likewise, the output signal of inverting transistor pair 80-82 enables transistor 84 to pass the bias signal from the gate of transistor 60 to the gate of transistor 62, turning the latter on and enabling its low impedance conduction path to bring the source voltage of transistor 50 closer to power supply conductor 24. Thus, the logic one from frequency sensor 16 enables transistors 62 and 66 to increase the operating potential for amplifying transistors 50 and 52. A higher operating potential increases the transconductance of amplifier 10 permitting full amplification therethrough.

Alternately, a logic zero from frequency sensor 16 disables transistors 78 and 84 thereby removing the bias potential from transistors 62 and 66 turning each off. Transistors 76 and 86 are enabled by the logic zero from frequency sensor 16 to discharge the gates of transistors 62 and 66 ensuring both are off. Thus, with the absence of valid voice data at terminals 12 and 14, transistors 60 and 64 create high impedances between the sources of transistors 50 and 52 and power supply conductors 24 and 42 thereby reducing the operation potential and transconductance of amplifier 10 while saving power consumption.

Hence, what has been provided is an improved amplifier with a frequency sensor responsive to the output frequency of the amplifier for reducing its supply voltage when the frequency falls below a predetermined threshold thereby conserving power when the input signal is invalid. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A circuit, comprising:

an amplifier circuit having a control input responsive to a first state of a control signal for amplifying an input signal with a power supply potential and providing an output signal having increased magnitude at an output, said amplifier circuit switching to a reduced power supply potential upon receiving a second state of said control signal; and first means having an input coupled to said output of said amplifier circuit for detecting an output frequency of said amplifier and having an output for providing said control signal having said first state when said output frequency is greater than a predetermined threshold and said second state when said output frequency is less than said predetermined threshold;

wherein said amplifier circuit includes:

a first transistor having a gate, a drain and a source, said gate being coupled for receiving said input signal;

second means coupled between said source of said first transistor and a first power supply conductor for varying the impedance path therebetween and adjusting the supply voltage of said first transistor in response to said first and second states of said control signal;

a second transistor having a gate, a drain and a source, said gate being coupled for receiving said input signal, said drains of said first and second transistors being coupled together for providing said output signal of said amplifier;

third means coupled between said source of said second transistor and a second power supply conductor for varying the impedance path therebetween and adjusting the supply voltage of said second transistor in response to said first and second states of said control signal;

a first inverter having an input coupled for receiving said control signal for providing an inverted control signal; and fourth means for generating first and second bias potentials at first and second outputs respectively; and wherein said second means includes:

a third transistor having a gate, a drain and a source, said gate being coupled for receiving said first bias potential, said source being coupled to said first power supply conductor, said drain being coupled to said source of said first transistor;

a fourth transistor having a gate, a drain and a source, said source being coupled to said first power supply conductor, said drain being coupled to said source of said first transistor;

a fifth transistor having a gate, a drain and a source, said gate being coupled for receiving said inverted control signal, said source being coupled to said first output of said fourth means for receiving said first bias potential, said drain being coupled to said gate of said fourth transistor; and a sixth transistor having a gate, a drain and a source, said gate being coupled for receiving said control signal, said source being coupled to said first power supply conductor, said drain being coupled to said gate of said fourth transistor.

2. The circuit of claim 1 wherein said third means includes:

a seventh transistor having a gate, a drain and a source, said gate being coupled for receiving said second bias potential, said source being coupled to said second power supply conductor, said drain being coupled to said source of said second transistor;

an eighth transistor having a gate, a drain and a source, said source being coupled to said second power supply conductor, said drain being coupled to said source of said second transistor;

a ninth transistor having a gate, a drain and a source, said gate being coupled for receiving said control signal, said drain being coupled to said second output of said fourth means for receiving said second bias potential, said source being coupled to said gate of said eighth transistor; and a tenth transistor having a gate, a drain and a source, said gate being coupled for receiving said inverted control signal, said source being coupled to said second power supply conductor, said drain being coupled to said gate of said eighth transistor.

3. The circuit of claim 2 wherein said first means includes:

first and second transmission gates each having an input, an output and a control input, said inputs being coupled together to said first power supply conductor, said outputs of said first and second transmission gates being coupled to first and second nodes respectively;

a second inverter having an input coupled to said output of said amplifier circuit and having an output coupled to said control inputs of said first and second transmission gates;

a first threshold detecting circuit having an input coupled to said first node and having an output;

a second threshold detecting circuit having an input coupled to said second node and having an output; and an exlcusive-NOR gate having first and second inputs and an output, said first input being coupled to said output of said first threshold detecting circuit, said second input being coupled to said output of said second threshold detecting circuit, said output being coupled to said control input of said amplifier circuit for providing said control signal.

4. The circuit of claim 3 wherein said first means further includes:

an eleventh transistor having a gate, a drain and a source, said gate being coupled to said output of said second inverter, said drain being coupled to said first node, said source being coupled to said second power supply conductor;

a first capacitor coupled between said first node and said second power supply conductor;

a twelfth transistor having a gate, a drain and a source, said gate being coupled to said output of said amplifier circuit, said drain being coupled to said second node, said source being coupled to said second power supply conductor; and a second capacitor coupled between said second node and said second power supply conductor.

5. A frequency, controllable amplifier circuit, comprising:

amplifying means having a control input responsive to a first state of a control signal for amplifying an input signal with a power supply potential applied across first and second power supply terminals for providing an output signal having increased magnitude at an output, said amplifying means switching to a reduced power supply potential upon receiving a second state of said control signal;

first means coupled between said first power supply terminal of said amplifying means and a first power supply conductor for varying the impedance path therebetween and adjusting said power supply potential of said amplifying means in response to said first and second states of said control signal;

second means coupled between said second power supply terminal of said amplifying means and a second power supply conductor for varying the impedance path therebetween and adjusting said power supply potential of said amplifying means in response to said first and second states of said control signal; and third means having an input coupled to said output of said amplifying means for detecting an output frequency of said amplifying means and having an output for providing said control signal having said first state when said output frequency is greater than a predetermined threshold and said second state when said output frequency is less than said predetermined threshold;

wherein said amplifying means includes:

a first transistor having a gate, a drain and a source, said gate being coupled for receiving said input signal; said source being coupled to said first power supply terminal;

a second transistor having a gate, a drain and a source, said gate being coupled for receiving said input signal, said source being coupled to said second power supply terminal, said drains of said first and second transistors being coupled together for providing said output signal of said amplifying means;

a first inverter having an input coupled for receiving said control signal for providing an inverted control signal; and fourth means for generating first and second bias potentials at first and second outputs respectively; and wherein said second first means includes:

a third transistor having a gate, a drain and a source, said gate being coupled for receiving said first bias potential, said source being coupled to said first power supply conductor, said drain being coupled to said source of said first transistor;

a fourth transistor having a gate, a drain and a source, said source being coupled to said first power supply conductor, said drain being coupled to said source of said first transistor;

a fifth transistor having a gate, a drain and a source, said gate being coupled for receiving said inverted control signal, said source being coupled to said first output of said fourth means for receiving said first bias potential, said drain being coupled to said gate of said fourth transistor; and a sixth transistor having a gate, a drain and a source, said gate being coupled for receiving said control signal, said source being coupled to said first power supply conductor, said drain being coupled to said gate of said fourth transistor.

6. The circuit of claim 5 wherein said second means includes:

a seventh transistor having a gate, a drain and a source, said gate being coupled for receiving said second bias potential, said source being coupled to said second power supply conductor, said drain being coupled to said source of said second transistor;

an eighth transistor having a gate, a drain and a source, said source being coupled to said second power supply conductor, said drain being coupled to said source of said second transistor;

a ninth transistor having a gate, a drain and a source, said gate being coupled for receiving said control signal, said drain being coupled to said second output of said fourth means for receiving said second bias potential, said source being coupled to said gate of said eighth transistor; and a tenth transistor having a gate, a drain and a source, said gate being coupled for receiving said inverted control signal, said source being coupled to said second power supply conductor, said drain being coupled to said gate of said eighth transistor.

7. The circuit of claim 6 wherein said third means includes:

first and second transmission gates each having an input, an output and a control input, said inputs being coupled together to said first power supply conductor, said outputs of said first and second transmission gates being coupled to first and second nodes respectively;

a second inverter having an input coupled to said output of said amplifying means and having an output coupled to said control inputs of said first and second transmission gates;

a first threshold detecting circuit having an input coupled to said first node and having an output;

a second threshold detecting circuit having an input coupled to said second node and having an output; and an exlcusive-NOR gate having first and second inputs and an output, said first input being coupled to said output of said first threshold detecting circuit, said second input being coupled to said output of said second threshold detecting circuit, said output being coupled to said control input of said amplifying means.

8. The circuit of claim 7 wherein said third means further includes:

an eleventh transistor having a gate, a drain and a source, said gate being coupled to said output of said second inverter, said drain being coupled to said first node, said source being coupled to said second power supply conductor;

a first capacitor coupled between said first node and said second power supply conductor;

a twelfth transistor having a gate, a drain and a source, said gate being coupled to said output of said amplifying means, said drain being coupled to said second node, said source being coupled to said second power supply conductor; and a second capacitor coupled between said second node and said second power supply conductor.

* * * * *